United States Patent [19]

Miyake

[11] Patent Number: 4,842,412
[45] Date of Patent: Jun. 27, 1989

[54] EXPOSURE APPARATUS EMPLOYED FOR FABRICATING PRINTED CIRCUIT BOARDS

[76] Inventor: Eiichi Miyake, D3-304, 7 Shinsenriminami-machi 3-chome, Toyonaka-shi, Osaka, Japan

[21] Appl. No.: 5,858

[22] Filed: Jan. 21, 1987

[30] Foreign Application Priority Data

| Jan. 22, 1986 | [JP] | Japan | 61-12914 |
| May 20, 1986 | [JP] | Japan | 61-76411 |
| May 21, 1986 | [JP] | Japan | 61-77467 |
| Jul. 15, 1986 | [JP] | Japan | 61-167278 |

[51] Int. Cl.$^4$ .............................................. G03B 27/04
[52] U.S. Cl. .................................................. 356/401
[58] Field of Search .................. 356/401, 399, 400; 271/5

[56] References Cited

U.S. PATENT DOCUMENTS

| 3,544,801 | 12/1970 | Dyck | 356/400 X |
| 3,739,247 | 6/1973 | Yamaguchi | 356/400 X |
| 4,109,158 | 8/1978 | Blitchington | 356/400 X |
| 4,126,376 | 11/1978 | Gommel et al. | 356/399 X |
| 4,161,652 | 7/1979 | Moreau et al. | 356/400 X |
| 4,315,692 | 2/1982 | Heinecke et al. | 356/399 |
| 4,385,838 | 5/1983 | Nakazawa et al. | 356/399 |
| 4,565,433 | 1/1986 | Yazaki | 271/5 X |
| 4,571,073 | 2/1986 | Diedrich et al. | 271/5 X |
| 4,596,468 | 6/1986 | Simeth | 356/400 |
| 4,626,683 | 12/1986 | Van Zeeland | 356/399 X |

OTHER PUBLICATIONS

R. Carson & H. Manner, Measurement System with Position Sensing Array, Jul. 1978, 741-742, vol. 21, No. 2, IBM Tech. Discl.
Khoury and Tompkins, Front Wafer Registration Device for Batch Process, Oct. 1977, vol. 20, No. 5, IBM Tech. Discl.

Primary Examiner—Richard A. Rosenberger
Attorney, Agent, or Firm—Lowe, Price, Leblanc, Becker & Shur

[57] ABSTRACT

An exposure apparatus for arranging an photomask having a plurality of alignment marks to face a surface to be exposed of a board having a plurality of corresponding alignment marks with the alignment marks of the photomask and the board being aligned to each other, to expose the board by radiating light through the photomask. The alignment marks of the board are different in size from the alignment marks of the photomask, whereby contours of the larger alignment marks encircle the smaller alignment marks when the board is overlapped with the photomask. In this state, the respective positions of the alignment marks of the board and the photomask are detected. The positions of the alignment marks thus detected are compared with each other to obtain displacement from desired positions, so that the photomask is moved in its surface direction to correct the displacement.

14 Claims, 13 Drawing Sheets

FIG. 11
FIG. 12
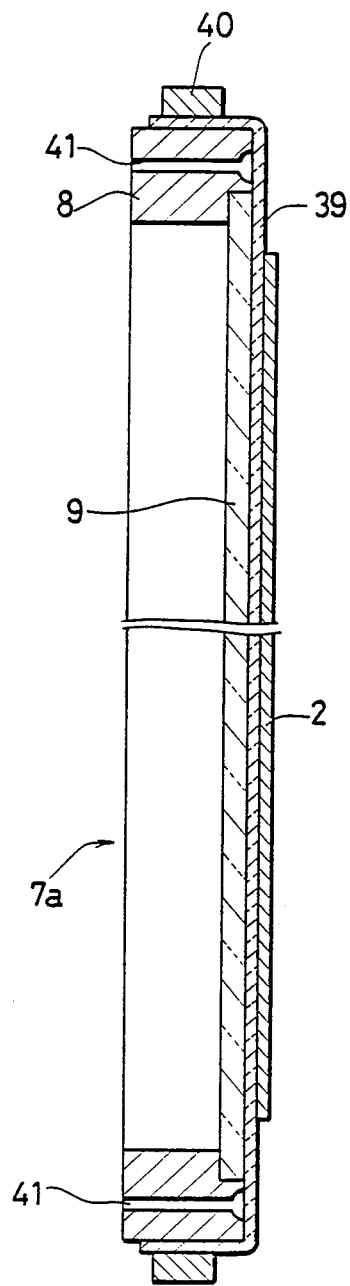
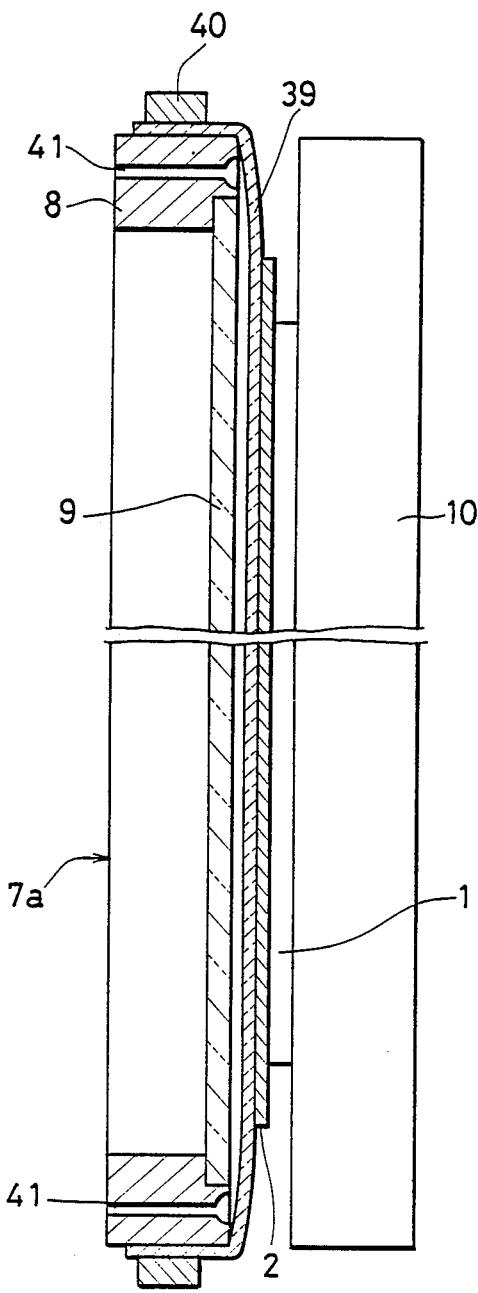

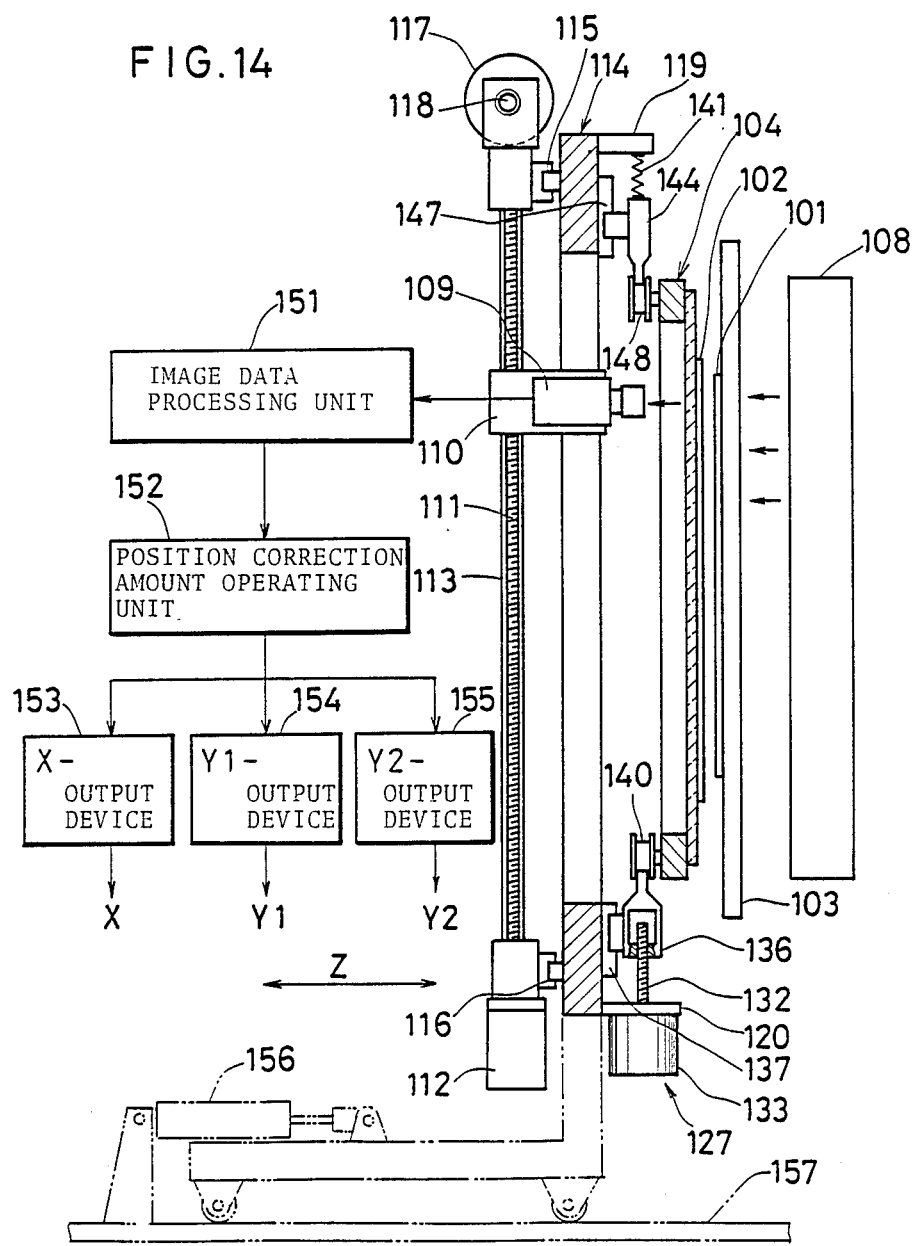

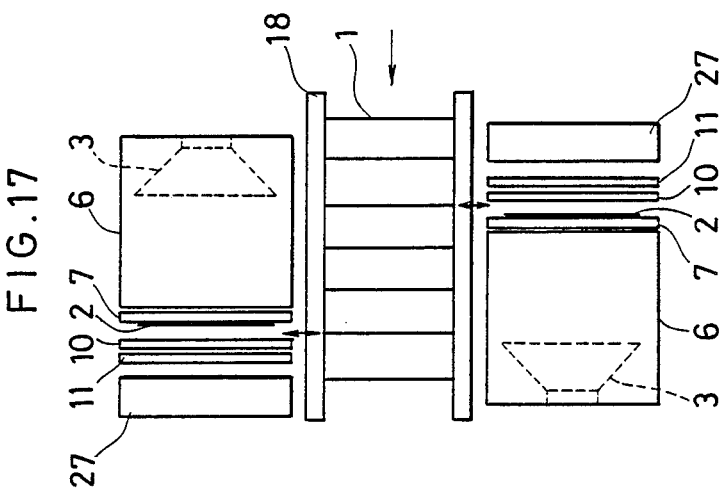
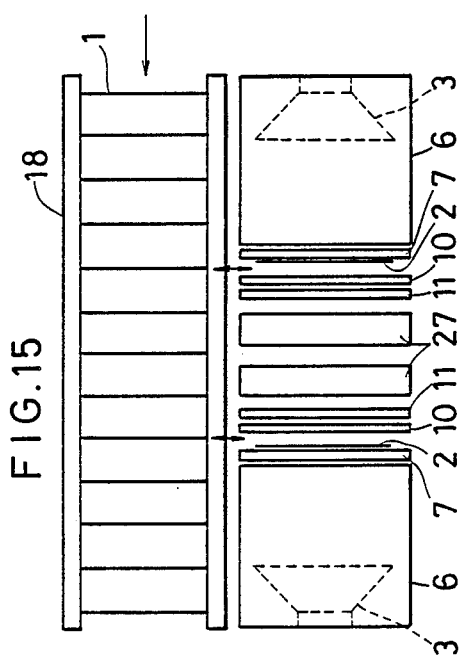
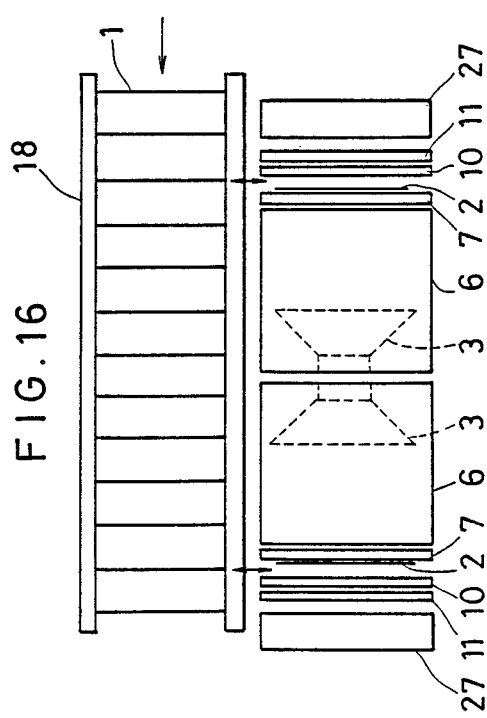

EXPOSURE APPARATUS EMPLOYED FOR FABRICATING PRINTED CIRCUIT BOARDS

BACKGROUND OF THE INVENTION

1. Field of the Invention

The present invention relates to an exposure apparatus employed in an optical exposure step of optical exposure technique for forming desired conductive patterns in fabrication of, e.g., printed circuit boards.

2. Description of the Prior Art

When optical exposure technique is applied to fabrication of, e.g., a printed circuit board, a board or panel for forming the printed circuit board must be correctly aligned with a photomask or artwork. Such alignment of the board and the photomask has been generally performed by inserting pins in a plurality of alignment holes provided in each of the board and the photomask.

However, the aforementioned alignment method has the following disadvantages:

(1) Pitch tolerance takes place in working of alignment holes of the board as well as those of the photomask. Also tolerance takes place in inner diameters of the alignment holes, whereby it may be impossible to insert the pins in accurately formed alignment holes of the board and the photomask to be fitted into the same.

Therefore, the pins are provided with play in outer diameter to some extent with respect to the diameters of the alignment holes under the present circumstances, and hence accuracy in alignment of the photomask and the board cannot be improved.

(2) The photomask is generally formed by a thin film of about 0.1 mm in thickness, which film is expanded and contracted by variation in temperature and humidity to reduce the accuracy.

(3) The photomask formed by the thin film is abraded by repeated engagement/disengagement of the pins in/from the alignment holes, whereby it is difficult to retain the accuracy.

With such disadvantage that the accuracy in alignment of the board and the photomask cannot be satisfactorily improved, the conventional alignment method cannot sufficiently cope with the recent printed circuit boards having patterns of higher density and smaller line width.

The conventional alignment method has the following further disadvantages:

(4) Upon insertion of the pins, fragments or chips are caused by abrasion of the board.

(5) In order to obtain multiproduct printed circuit boards, the positions of the pins must be accurately shifted per change in lot, while such operation is relatively difficult and takes time.

SUMMARY OF THE INVENTION

Accordingly, an object of the present invention is to overcome the aforementioned disadvantages and provide an exposure apparatus which can accurately align boards to the photomask while efficiently performing alignment of the boards and the photomask and exposure of the boards.

The exposure apparatus according to the present invention is adapted to arrange a photomask having a plurality of alignment marks to face the surface to be exposed of a board having a plurality of corresponding alignment marks with the alignment marks being aligned to each other for exposing the board by light radiated through the photomask, and the aforementioned technical problems are solved as follows:

The exposure apparatus according to the present invention has a board standby station and an exposure station. The alignment marks of the board are different in size from those of the photomask. The exposure apparatus further comprises:

(1) a board holder, capable of transmitting light, for vertically vacuum-clamping the board and reciprocating between the board standby station and the exposure station;

(2) a photomask holder for vertically holding the photomask in the exposure station;

(3) a optical detecting equipment formed by combination of position detecting light sources and optical sensor for detecting the alignment marks of the board and the photomask being overlapped in the exposure station;

(4) comparing equipment for comparing the positions of the alignment marks of the board detected by the optical sensor with those of the photomask;

(5) X-Y-$\theta$ direction driving equipment for moving the photomask holder in vertical, lateral and rotational directions for correcting misalignment of the alignment marks of the board and the photomask based on data obtained by the comparing equipment; and (6) An exposure light source for radiating light to the board through the photomask.

In such structure, the board holder vacuum-clamping the board is moved to the exposure station. More specifically, the board has been supplied to the board holder in the board standby station, and the board holder is moved to the exposure station so that the alignment marks of the photomask already located in the exposure station substantially correspond in position to the alignment marks of the board brought in the exposure station at this time.

Then, the photomask and the board are relatively moved at need to be in proximity to each other, and this movement is stopped with a small clearance defined between the photomask and the board. The optical sensor is located in a position axially extended from the centers of the alignment marks. The method of detecting the positions of the alignment marks depends on whether the alignment marks of the board or those of the photomask are larger than the others, while the said positions of the alignment marks can be detected in an overlapped state in any case, since the alignment marks of the board are different in size from those of the photomask.

Then, misalignment of the alignment marks of the board and the photomask thus detected is obtained by the comparing equipment. On the basis of the data obtained by the comparing equipment, the X-Y-$\theta$ direction driving equipment moves the photomask holder in the vertical, lateral and rotational directions, thereby to move the photomask to correct the misalignment of the alignment marks of the photomask and the board. Then the board and the photomask are brought into proximity to each other at need, to expose the board by the exposure light source in this state. Upon completion of the exposure, the board and the photomask are separated from each other at need, and the board holder holding the board is returned to the board standby station, so that the board is replaced by a board to be subsequently exposed.

Thus, according to the present invention, the alignment marks are detected by optical technique through the optical sensor to operate misalignment in position of the alignment marks of the board and the photomask in the comparing equipment thereby to correct the position of the photomask, whereby alignment can be so performed as to most average alignment of the plurality of alignment marks in position.

The board, fixed through the board holder capable of transmitting light, is hardly abraded in comparison with that in the conventional system employing alignment pins, whereby the board can be highly accurately aligned to the photomask.

Even if the board to be vacuum-clamped by the board holder is warped, such warp is corrected by a suction face of the board holder, whereby no error is caused by the warp in measurement of the positions of the alignment marks. The photomask can also be retained in a flat state since the same is held by the photomask holder.

In the exposure apparatus according to the present invention, the board and the photomask are handled in vertical states. Thus, the exposure apparatus can be made compact, particularly in the occupied floor space, while the board and the photomask are prevented from contact with dust which may cause a serious problem in the exposure step. Further, the board can be easily loaded and unloaded. In order to replace the photomask by another type, a number of photomask holders holding required types of photomasks may be previously prepared to be exchanged with the corresponding photomasks to reduce the time required for lot change and simplify management, and also in this case, the aforementioned vertical system facilitates easy exchange of the photomask holders and easy storage/offtake. In order to automate the exposure apparatus, further, a carriage may be prepared to vertically retain several tens of photomask holders holding photomasks to automatically transfer desired photomask holders between the carriage and the exposure apparatus through a previously generated program.

According to the present invention, the photomask holder is not adapted to reciprocate between the board standby station and the exposure station, but to continuously remain in the exposure station. On the other hand, the board holder is moved between the board standby station and the exposure station. Therefore, merely the X-Y-$\theta$ direction driving equipment for alignment may be driven at the minimum for the photomask holder, while the mechanism for moving the board holder between the stations may be provided at the minimum. Thus, the photomask holder and the board holder are supplied with motion by separate mechanisms, whereby there is no need to consider interference between the mechanisms, to prevent complicated structure.

According to the present invention, further, the alignment marks are detected while overlapping the photomask and the board to thereafter simply bring the same into proximity to each other, whereby no error is caused by movement of the photomask and/or the board upon alignment.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 and 12 are sectional views for illustrating other examples of the photomask holder;

FIG. 14 illustrates the principal part of the exposure apparatus including the movement driver as shown in FIG. 13 in a direction parallel to the plane of the photomask 102 as well as a block diagram of a control system;

FIGS. 15, 16 and 17 are schematic top plan views of further embodiments of the present invention respectively;

DESCRIPTION OF THE PREFERRED EMBODIMENTS

Description is now made of preferred embodiments of the present invention with reference to the accompanying drawings.

Figure 1:
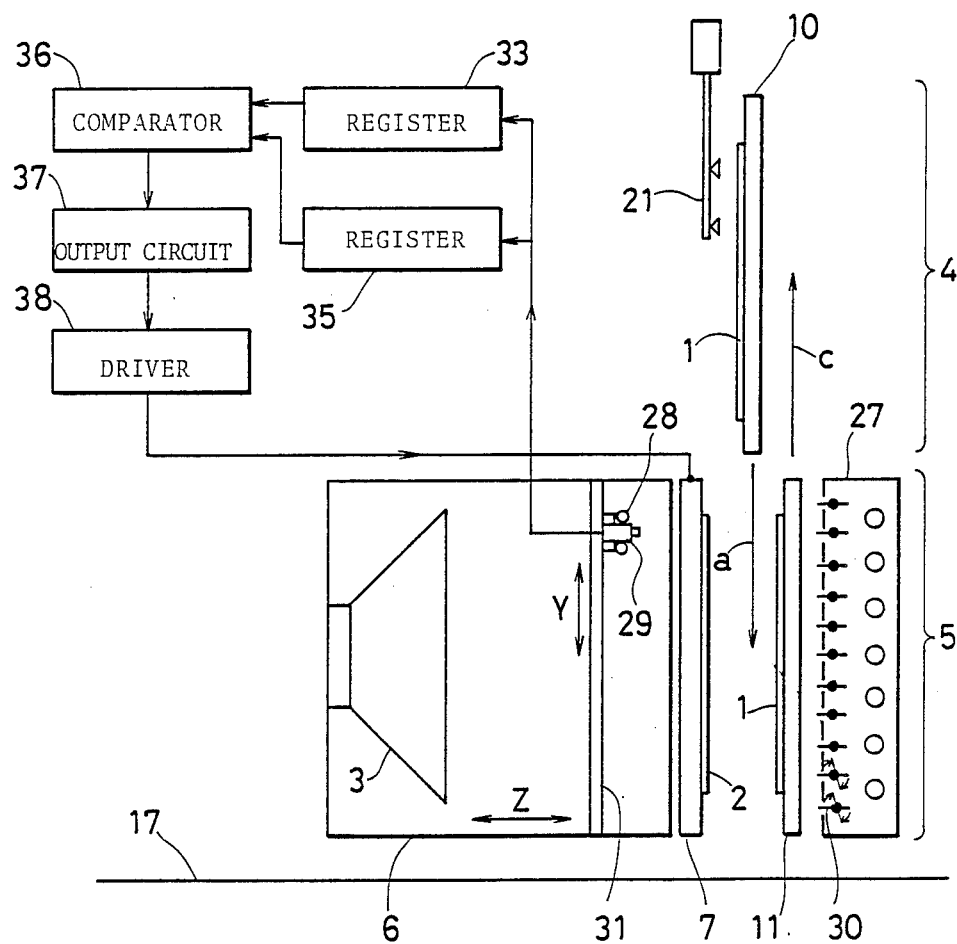
FIG. 1 shows a front elevational view of an exposure apparatus according to an embodiment of the present invention, as well as a block diagram of a control system.
Figure 2:
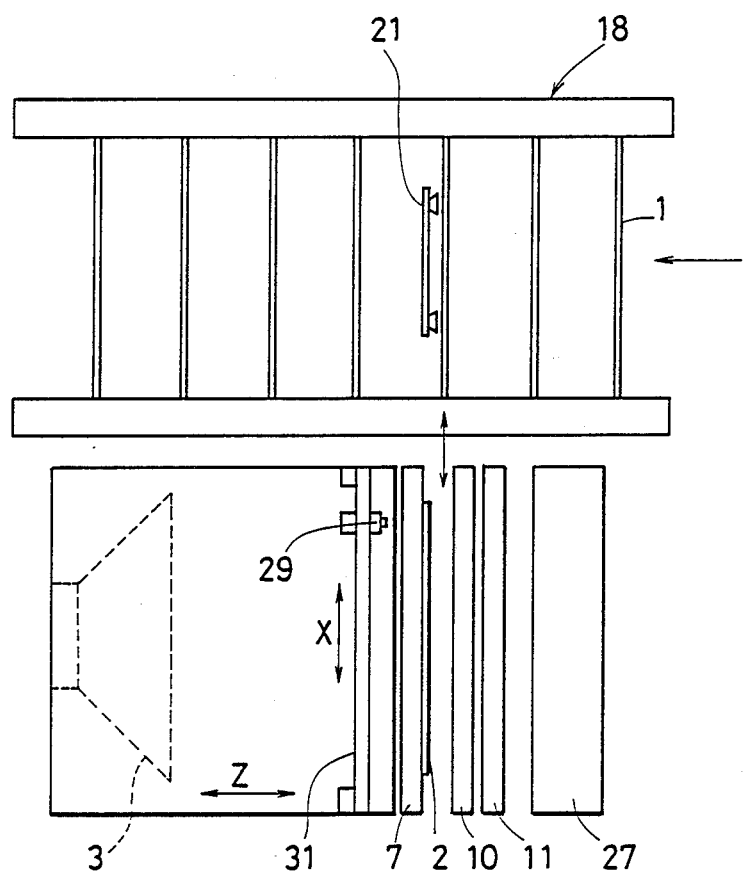
FIG. 2 is a top plan view of the exposure apparatus as shown in FIG. 1.

FIG. 1 shows a front elevational view of an exposure apparatus according to an embodiment of the present invention, as well as a block diagram of a related control system. FIG. 2 is a top plan view of the exposure apparatus as shown in FIG. 1. The exposure apparatus shown in FIGS. 1 and 2 is adapted with align boards 1 to a photomask 2 and expose same through an exposure light source 3. This exposure apparatus includes a board standby station 4 and an exposure station 5 in relation to movement of the boards 1. The exposure light source 3 is contained in a light source cabinet 6, to be located in the exposure station 5.

Figure 3:
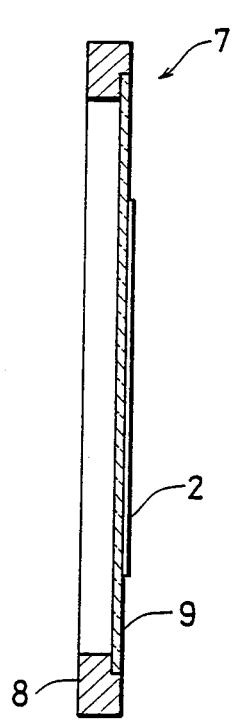
FIG. 3 is an enlarged sectional view, as viewed from the front of the apparatus, of a photomask holder 7 as shown in FIGS. 1 and 2.

The photomask 2 is vertically held by a photomask holder 7 located in the exposure station 5. As obvious from FIG. 3 showing an enlarged sectional view, the photomask holder 7 comprises a frame part 8, which retains a transparent board 9 of a flat glass plate or the like. The photomask 2 is brought into direct contact with one surface of the transparent board 9 and fixed by an adhesive tape (not shown), for example.

Figure 4:
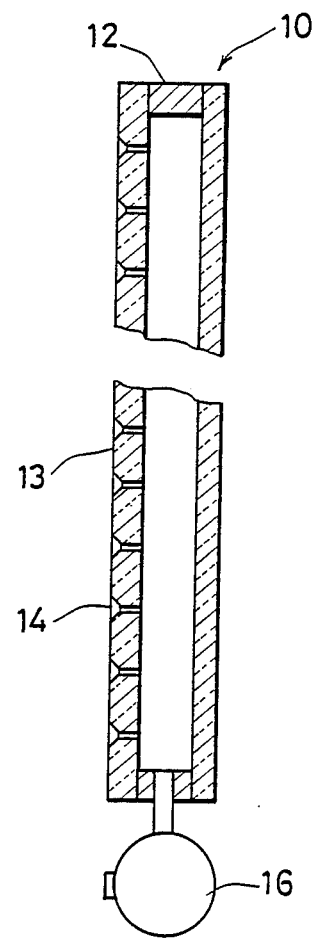
FIG. 4 is an enlarged sectional view, as viewed from the front of the apparatus, of a board holder 10 as shown in FIGS. 1 and 2.

As shown in FIGS. 1 and 2, two board holders 10 and 11 are provided in this embodiment to hold the boards 1. The board holders 10 and 11 are identical in structure to each other. FIG. 4 is an enlarged sectional view showing the structure of the board holder 10. The board holder 10 is formed by adhering two plates of colorless transparent acrylic resin or transparent acrylic resin of a color close to the surface color of the boards 1 with interposition of a spacer frame 12. One of the surfaces of the board holder 10 serves as a suction face 13 for the boards 1. The suction face 13 is a flat plane provided with a number of suction holes 14. The board holder 10 transmits light from a position detecting light source 27 (FIGS. 1 and 2) as hereinafter described, and the suction holes 14 are preferably chamfered as shown in FIG. 4, in order to prevent variation in density of the light transmitted through the same. The inner space of the board holder 10 is coupled to a vacuum pump 16. The other board holder 11 is similar in structure to the board holder 10 as described above.

Thus, the board holders 10 and 11 are adapted to vacuum-clamp the boards 1 and vertically hold the same. The board holders 10 and 11 are vertically moved along arrows a and c, in relation to a floor surface 17 as shown in FIG. 1, to reciprocate between the board standby station 4 and the exposure station 5.

Figure 5:
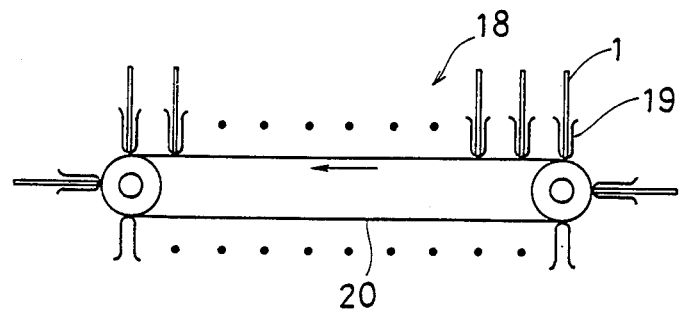
FIG. 5 is a front elevational view of a loader 18 as shown in FIG. 2.

The boards 1 are loaded and unloaded by a conveyor-type loader 18 as shown in a top plan view in FIG. 2. As front elevationally shown in FIG. 5, the loader 18 is formed by a plurality of receivers 19 mounted at regular intervals on an endless belt 20 for holding the boards 1. Each board 1 is inserted in the receiver 19 being in a horizontal position as shown in the right-hand end in FIG. 5, and taken out from the same being in an inverted horizontal position as shown in the left-hand end in FIG. 5. An unfinished board 1 vertically located on the horizontal part of the endless belt 20 is taken out from the receiver 19 by a suction finger 21 (FIGS. 1 and 2) while a finished board 1 is returned into the receiver 19.

In order to remove the boards 1 from the loader 18 by the suction finger 21, it is preferable to horizontally and vertically register the boards 1 in an outlet position of the loader 18 in advance through a pusher mechanism or the like. Thus, the boards 1 taken out by the suction finger 21 are always held in a constant relative position with respect to the suction finger 21, to be correctly supplied to a constant position of the board holder 10 or 11.

Figure 6:
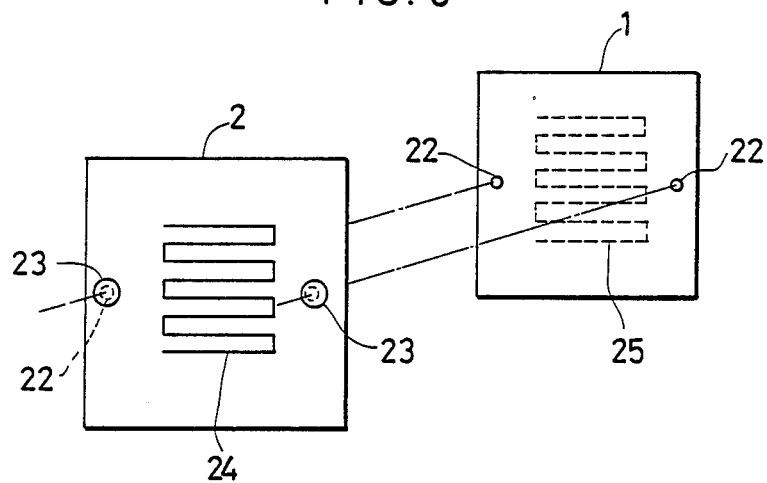
FIG. 6 is a schematic diagram for illustrating an aligned state of a board 1 and an photomask 2.

As shown in FIG. 6, each board 1 and the photomask 2 has a plurality of, e.g., two alignment marks 22 or 23. The alignment marks 22 and 23 as shown in FIG. 6 are enlarged as compared with those in practice, for convenience of illustration. The photomask 2 is formed with an arbitrary pattern 24, so that a pattern 25 correlated with the pattern 24 is transferred onto the board 1 upon radiation of light from the exposure light source 3 of the board 1 through the photomask 2. The surface of the board 1 to be exposed is coated with a photosensitive material or adhered with a photosensitive film. When conductive patterns are formed on both sides of the board 1, the photosensitive materials or the like are coated on the said both sides.

Figure 7:
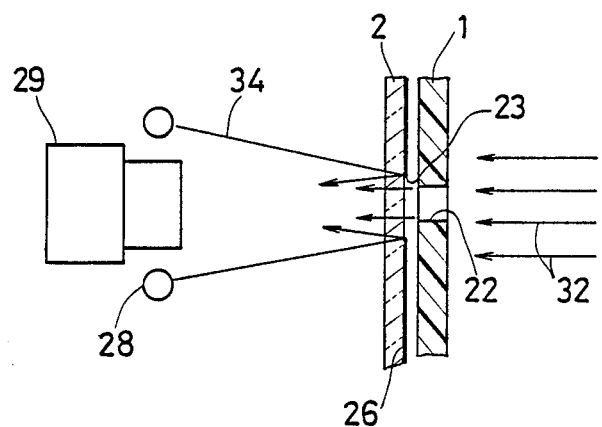
FIG. 7 is a sectional view for illustrating a method of detecting positions of alignment marks 22 and 23 of the board 1 and the photomask 2.

FIG. 7 is a sectional view showing an overlapped state of the board 1 and the photomask 2. As obvious from FIG. 7, the alignment marks 22 of the board 1 are in the form of through holes passing through the board 1. The alignment marks 23 of the photomask 2 are formed as transparent regions enclosed by a non-transparent area 26 formed on the transparent photomask 2 in the surface facing the board 1. The non-transparent area 26 can be formed through technique similar to that of forming the pattern 24 on the photomask 2. According to this embodiment, further, the alignment marks 22 of the board 1 are smaller than the alignment marks 23 of the photomask 2. The alignment marks 23 of the photomask 2 may be formed as through holes similarly to the alignment marks of the board 1.

An optical detector is provided in order to detect positions of the alignment marks 22 and 23 of the board 1 and the photomask 2. According to this embodiment, the optical detector is formed by combination of first and second position detecting light sources 27 and 28 and an optical sensor 29, as shown in FIGS. 1, 2 and 7.

The first position detecting light source 27 can emit light rays which cover the board 1 and the photomask 2 in size, and is located at the side of the board 1. The position detecting light source 27 has a plurality of shutters 30, rotation of which is controlled to pass or cut off the light from the position detecting light source 27, as partially shown by phantom lines in FIG. 1.

The second position detecting light source 28 is provided in the vicinity of the optical sensor 29, to be integrally moved with the optical sensor 29. The optical sensor 29 and the second position detecting light source 28 are located at the side of the photomask 2 and contained in the light source cabinet 6. The optical sensor 29 is preferably formed by a digital address system sensor which can pick up images of configurations of the alignment marks 22 and 23. Further, the optical sensor 29 is mounted on an X-Y table 31 with the second position detecting light source 28, thereby to be movable along the surface direction of the board 1 or the photomask 2, i.e., in directions X and Y.

The first and second position detecting light sources 27 and 28 are adapted to provide light longer than yellow in wavelength, for example.

Figure 8:
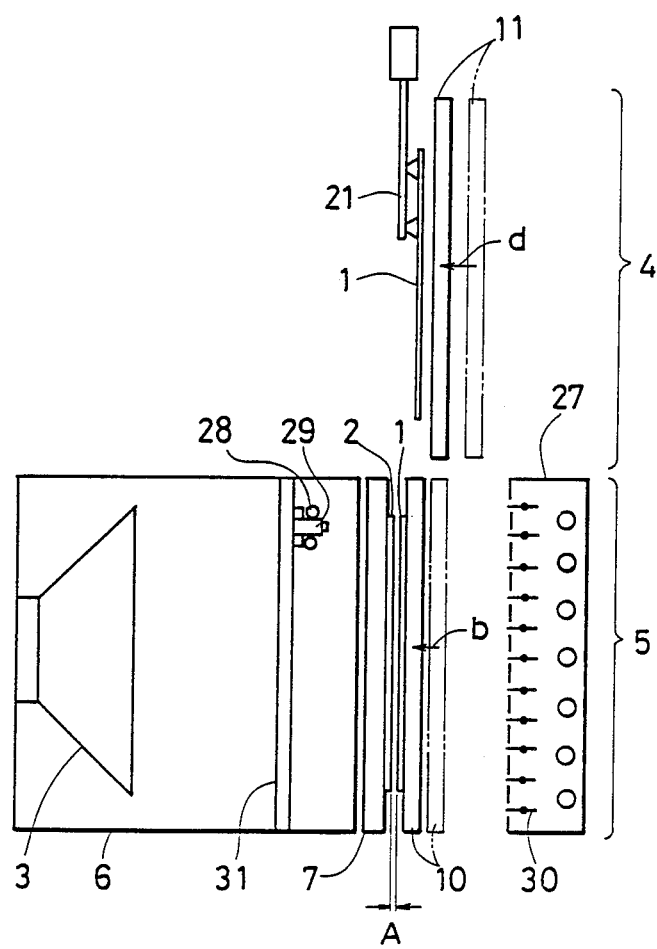
FIGS. 8 and 9 are front elevational views of the exposure apparatus as shown in FIG. 1 for illustrating the operation thereof.
Figure 9:
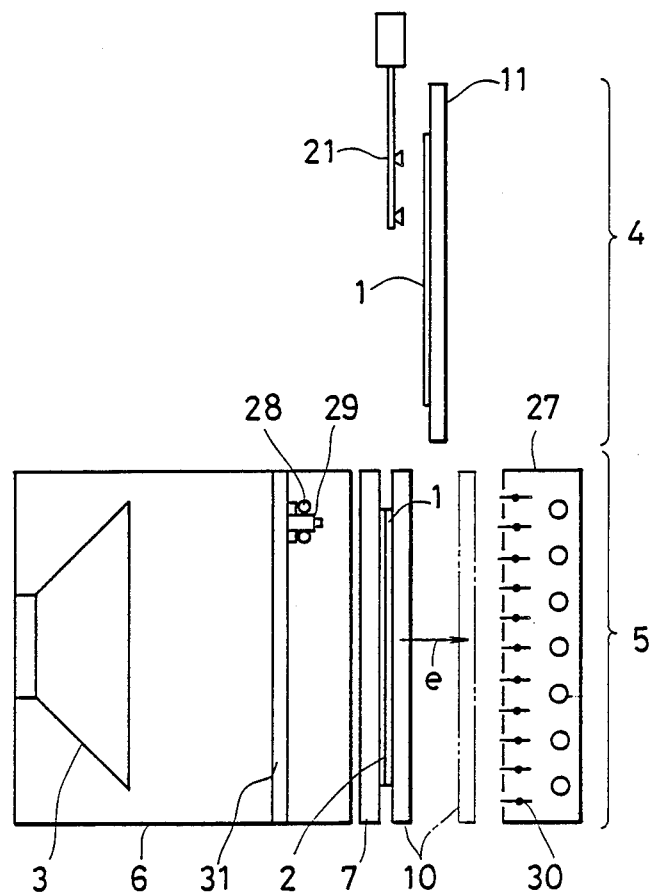

With reference to FIGS. 1, 8 and 9, description is now made on the operation of the exposure apparatus and the related control system. FIGS. 8 and 9 show the exposure apparatus at an angle similar to that of FIG. 1.

In the stage as shown in FIG. 1, the first board holder 10 is in the board standby station 4, to receive a board 1 to be subsequently exposed from the suction finger 21 and vacuum-clamps the same. On the other hand, the second board holder 11 vacuum-clamping an already exposed board 1 is separated from the photomask 2, i.e., from the photomask holder 7 in a direction Z.

Then, in the state as shown in FIG. 8, the first board holder 10 is moved along the arrow a (FIG. 1) to be brought in a position as shown by the phantom line in FIG. 8, and then moved along the arrow b, i.e., in the direction Z to bring the board 1 in proximity to the photomask 2. At this time, a clearance A between the board 1 and the photomask 2 is preferably within 0.5 mm. On the other hand, the second board holder 11 is moved along the arrow c (FIG. 1) from the position in the exposure station 5 to reach the board standby station 4 as shown by the phantom line in FIG. 8, and is further moved along the arrow d to approach the suction finger 21. Then the already exposed board 1 is taken out by the suction finger 21 to be returned to the loader 18 as shown in FIG. 2. When the suction finger 21 takes out the board 1 from the board holder 10 or 11, the operation of the vacuum pump 16 (FIG. 4) for supplying negative pressure to the board holder 10 or 11 is stopped.

In the stage as shown in FIG. 8, further, positions of the alignment marks of the photomask 2 and the board 1 in the exposure station 5 are detected. Namely, the shutters 30 of the first position detecting light source 27 are opened so that the positions of the alignment marks 22 are detected by the optical sensor 29 in the form of transmitted light of light rays 32 from the first position detecting light source 27 as shown in FIG. 7. Measured data with respect to the positions of the alignment marks 22 are stored in a first register 33 as shown in FIG. 1.

Then, the shutters 30 of the first position detecting light source 27 are closed, and light rays 34 are emitted from the second position detecting light source 28. The positions of the alignment marks 23 of the photomask 2 are detected by the optical sensor 29 in the form of reflected light through the said light rays 34. Measured data with respect to the positions of the alignment marks 23 are stored in a second register 35 as shown in FIG. 1. The optical sensor 29 is moved with the second position detecting light source 28 upon driving of the X-Y table 31, to sequentially detect the positions of the alignment marks 22 and 23 of the board 1 and the photomask 2.

Then, respective outputs from the first and second registers 33 an 35 are inputted in a comparator 36, which in turn operates misalignment of the board 1 and the photomask 2. The said operation is so performed that the positions of the two alignment marks 22 of the board 1 and the two alignment marks 23 of the photomask 2 are most aligned in average. When, for example, the alignment marks 22 of the board 1 are misaligned to the alignment marks 23 of the photomask 2 as shown by dotted lines in FIG. 6, the operation for position correction is so performed as to average misalignment of the two pairs of alignment marks 22 and 23.

The misalignment data outputted from the comparator 36 are supplied to an output circuit 37, which in turn drives an X-Y-$\theta$ direction driver 38. The X-Y-$\theta$ direction driver 38 is adapted to move the photomask holder 7 in vertical, lateral and rotational directions in order to correct misalignment of the alignment marks 22 and 23.

When the positions of the board 1 and the photomask 2 being in the exposure station 5 are completely corrected in the stage of FIG. 8, the first board holder 10 is further moved in the direction Z as shown in FIG. 9, so that the board 1 is in contact with the photomask 2. This contact state corresponds to the so-called "soft contact" state, which is not so intimate that a substantially vacuum state is defined between the board 1 and the photomask 3. The exposure light source 3 emits light from the photomask 2 side, to expose one surface of the board 1. At this time, the optical sensor 29 and the second position detecting light source 28 are retracted to positions not obstructing the light from the exposure light source 3. The exposure light source 3 is adapted to emit ultraviolet rays for example, preferably in the form of parallel rays in order to improve exposure accuracy.

On the other hand, the second board holder 11, being in the board standby station 4 and having transferred the already exposed board 1 to the suction finger 21 in the stage as shown in FIG. 8, vacuum-clamps a board 1 to be subsequently exposed as shown in FIG. 9. This board 1 to be subsequently exposed is picked up from the loader 18 by the suction finger 21, to be carried to the front of the second board holder 11 being in the board standby station 4. At this time, the space between the board holder 11 and the board 1 is preferably reduced to the minimum. The vacuum pump 16 (FIG. 4) coupled to the board holder 11 is driven to supply negative pressure to the second board holder 11, so that the board 1 is clamped on the second board holder 11 as shown in FIG. 9. Thereafter the suction finger 21 is returned onto the loader 18.

After exposure processing is completed in the exposure station 5 as shown in FIG. 9, the first board holder 10 holding the exposed board 1 is moved along an arrow e in FIG. 9, to the position indicated by the phantom line. In other words, the exposed board 1 is separated from the photomask 2.

Then the first board holder 10 is moved along the arrow c as shown in FIG. 1 and the second board holder 11 is moved along the arrow a as shown in FIG. 1. This operation is similar to the aforementioned operation from the stage of FIG. 1 to the stage as indicated by the phantom lines in FIG. 8, except for that the first board holder 10 is replaced by the second board holder 11. Thus, the aforementioned operation is repeated to sequentially perform automatic exposure processing of the boards 1.

Figure 10:
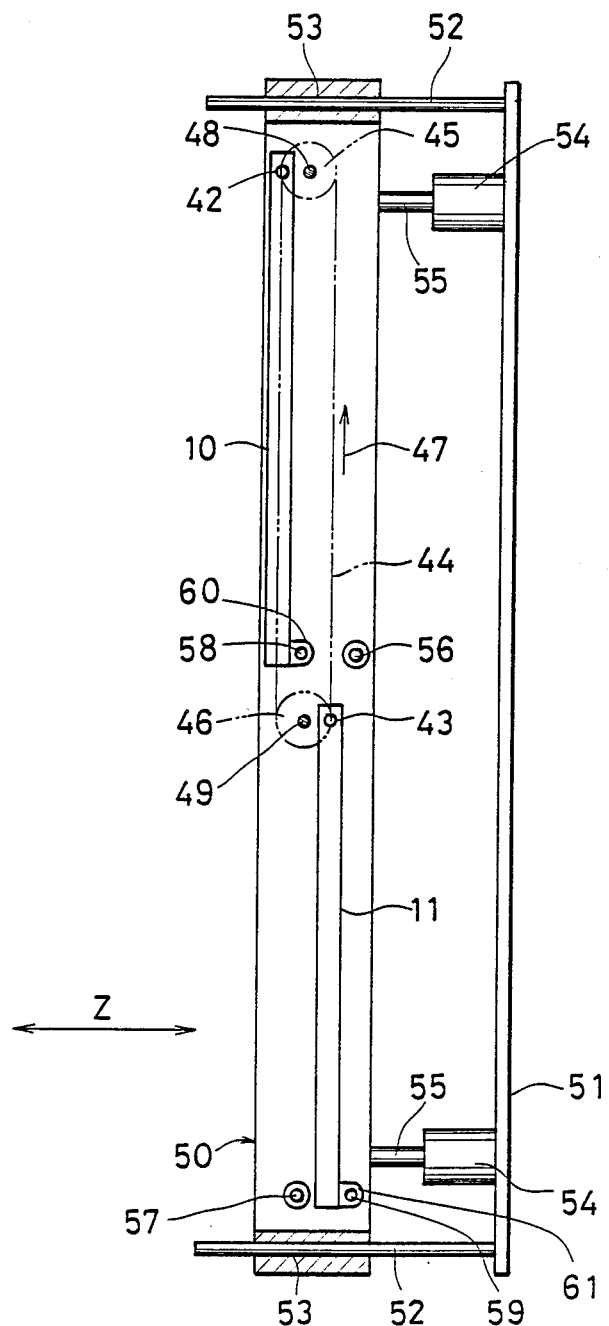
FIG. 10 is an enlarged front elevational view showing an example of a mechanism for moving the board holders 10 and 11 as shown in FIGS. 1, 8 and 9.

As hereinabove described, the board holders 10 and 11 are moved in sequence along the arrows a (FIG. 1), b (FIG. 8), e (FIG. 9), c (FIG. 1), d (FIG. 8) and again a. With reference to FIG. 10, description is now made on an example of a concrete mechanism for achieving such movement of the board holders 10 and 11.

Referring to FIG. 10, two board holders 10 and 11 are mounted on an endless chain 44 through coupling pins 42 and 43 respectively. The chain 44 is extended along a pair of sprockets 45 and 46, and a driving motor (not shown) is coupled to either the sprocket 45 or 46 to intermittently drive the chain 44 in the direction indicated by an arrow 47. Although the coupling pins 42 and 43, the chain 44 and the sprockets 45 and 46 are shown as single members in FIG. 10, two coupling pins 42 are provided on both upper end portions of the board holder 10 and two coupling pins 43 are provided on both upper end portions of the board holder 11, while pairs of chains 44 and sprockets 45 and 46 are provided on both sides of the board holders 10 and 11 respectively.

Respective rotary shafts 48 and 49 of the sprockets 45 and 46 are rotatably retained by a frame 50. A base 51 is provided opposite to the frame 50, to serve as a fixed part. The base 51 is a structure that doesn't obstruct passage of the light from the first position detecting light source 27 as shown in FIG. 1 etc. The base 51 is provided with Z-direction guide rods 52, which are distributed in a plurality of portions to project toward the frame 50. The respective guide rods 52 are inserted in guide holes 53 formed in corresponding positions of the frame 50. Thus, the frame 50 is guided by the guide rods 52 to be moved in the direction Z.

The base 51 is further provided with cylinders or actuators 54 which are distributed in a plurality of portions to drive the aforementioned movement of the frame 50 in the direction Z. End portions of plungers 55 of the respective actuators 54 are coupled to the frame 50. Thus, the frame 50 is driven by the actuators 54 to reciprocate along the direction Z with the board holders 10 and 11.

The board holders 10 and 11 must be constantly retained in position in the respective steps of loading and unloading the boards 1, aligning the boards 1 to the photomask 2 and exposing the boards 1 as hereinabove described with reference to FIGS. 1, 8 and 9. Therefore, the frame 50 is provided with knock pins 56 and 57. Single pairs of such knock pins 56 and 57 are provided to project from opposite inner side surfaces of the frame 50. On the other hand, brackets 60 and 61 having alignment holes 58 and 59 for receiving the knock pins 56 and 57 are provided on both sides of lower end portions of the board holders 10 and 11.

When the chain 44 is so driven that, e.g., the board holder 10 is directly downwardly moved from the position as shown in FIG. 10, the knock pins 57 project to be fitted into the alignment holes 58 thereby to fix the board holder 10 to the frame 50. On the other hand, when the chain 44 drives the other board holder 11 to upwardly move the same directly from the position as shown in FIG. 10, the knock pins 56 project to be fitted into the alignment holes 59 thereby to fix the board holder 11 to the frame 50. In such state, the aforementioned aligning and exposing steps are performed on the board holder 10 while the aforementioned step of loading and unloading the board 1 is performed on the board holder 11.

Relation between the movement of the aforementioned mechanism as shown in FIG. 10 and the movement of the board holders 10 and 11 as shown in FIGS. 1, 8 and 9 is as follows: The movement along the arrows a and c is driven by the chain 44 and the movement along the arrows b, e and d is driven by the actuators 54.

The board holders 10 and 11 may be driven to reciprocate between the board standby station 4 and the exposure station 5 by driving means such as air cylinders.

Although the alignment marks 22 of the board 1 are first detected by the optical sensor 29 to thereafter detect the alignment marks 23 of the photomask 2 in the above description with reference to FIG. 7, such detection of the alignment marks may be reversed in sequence.

In the aforementioned embodiment, the two board holders 10 and 11 are employed for holding the boards 1 and substantially alternately reciprocating between the board standby station 4 and the exposure station 5. By such structure, a board 1 can be aligned to the photomask 2 or exposed in relation to one of the board holders 10 and 11 while another board 1 is loaded to/unloaded from the other board holder 11 or 10. Thus, a plurality of operations can be simultaneously performed to attain higher throughput. However, if such an advantage is not desired, only one of the board holders may be employed to perform the respective operations in a series manner.

In the aforementioned embodiment, further, the two board holders 10 and 11 are employed to be moved along the arrow d as shown in FIG. 8 and along a relatively long path as shown by the arrow e in FIG. 9 in order to avoid interference during movement of the board holders 10 and 11. However, if the apparatus is provided with only one board holder, the same may be directly brought in the position of the board holder 10 as shown by the phantom line in FIG. 8 following movement from the board standby station 4 to the exposure station 5.

The board standby station 4 and the exposure station 5 in the aforementioned embodiment may be inverted in vertical arrangement. Further, the board standby station 4 and the exposure station 5 may be horizontally arranged so that a board holder horizontally reciprocates between the same.

FIGS. 11 and 12 illustrate another example of the photomask holder. This photomask holder 7a is adapted to improve contact between the photomask 2 and the board 1.

The photomask holder 7a is provided with a transparent film 39 covering a transparent board 9, and peripheral edge portions of the transparent film 39 are fixed to a frame portion 8 through clamp members 40. This transparent film 39 is more flexible than the rigid transparent board 9. The frame portions 8 are provided with small holes 41 to communicate with a clearance between the transparent board 9 and the transparent film 39. The small holes 41 are selectively supplied with negative or positive pressure. Photomask 2 is adhered onto the outer surface of the transparent film 39 through an adhesive tape (not shown) or the like.

In order to improve contact between the photomask 2 and the board 1 during exposure, e.g., a board holder 10 vacuum-clamping the board 1 is pressed against the photomask holder 7a holding the photomask 2 as shown in FIG. 12 to be in intimate contact therewith and positive pressure is supplied to the small holes 41, so that air pressure in the clearance between the transparent board 9 and the transparent film 39 is increased to expand the transparent film 39. Thus, the photomask 2 is further pressed against the board 1, to improve contact between the same.

In order to detect the position of the photomask 2, negative pressure is supplied to the small holes 41 to produce a vacuum between the transparent board 9 and the transparent film 39, whereby the transparent film 39 comes in intimate contact with the transparent board 9 and the photomask 2 is brought into a flat state.

The expansion of the transparent film 39 by pressurization is within a range of about 0.2 mm since the transparent film 39 is expanded by the pressure contact of the photomask holder 7a and the board holder 10 or 11, which expansion exerts substantially no influence on other accuracy.

In the aforementioned embodiment as shown in FIGS. 1 to 9, the board 1 in the exposure step has been retained in the so-called "soft contact" state with respect to the photomask 2. In addition to the "soft contact" state, contact modes of the board 1 and the photomask 2 in exposure include "hard contact" and "off contact" states. The embodiment as shown in FIGS. 11 and 12 may be regarded as employing a type of "hard contact" mode. In the "off contact" state, a clearance is positively defined between the board 1 and the photomask 2 as in the aligned state of FIG. 7. According to the present invention, any of the aforementioned "soft contact", "hard contact" and "off contact" modes can be employed. In case of the "soft contact" or "off contact" mode, no air pressure control operation is required to improve contact between the board 1 and the photomask 2 as in the case of the "hard contact" mode, whereby workability is improved. Further, the board 1 and the photomask 2 may be protected against flaws since the same are not hardly brought into contact with each other. Although the exposure light source 3 is required to emit parallel rays in higher accuracy particularly in the case of the "off contact" mode, the same may be prepared by simply coating liquid resist on a photosensitive material having a soft surface.

Figure 13:
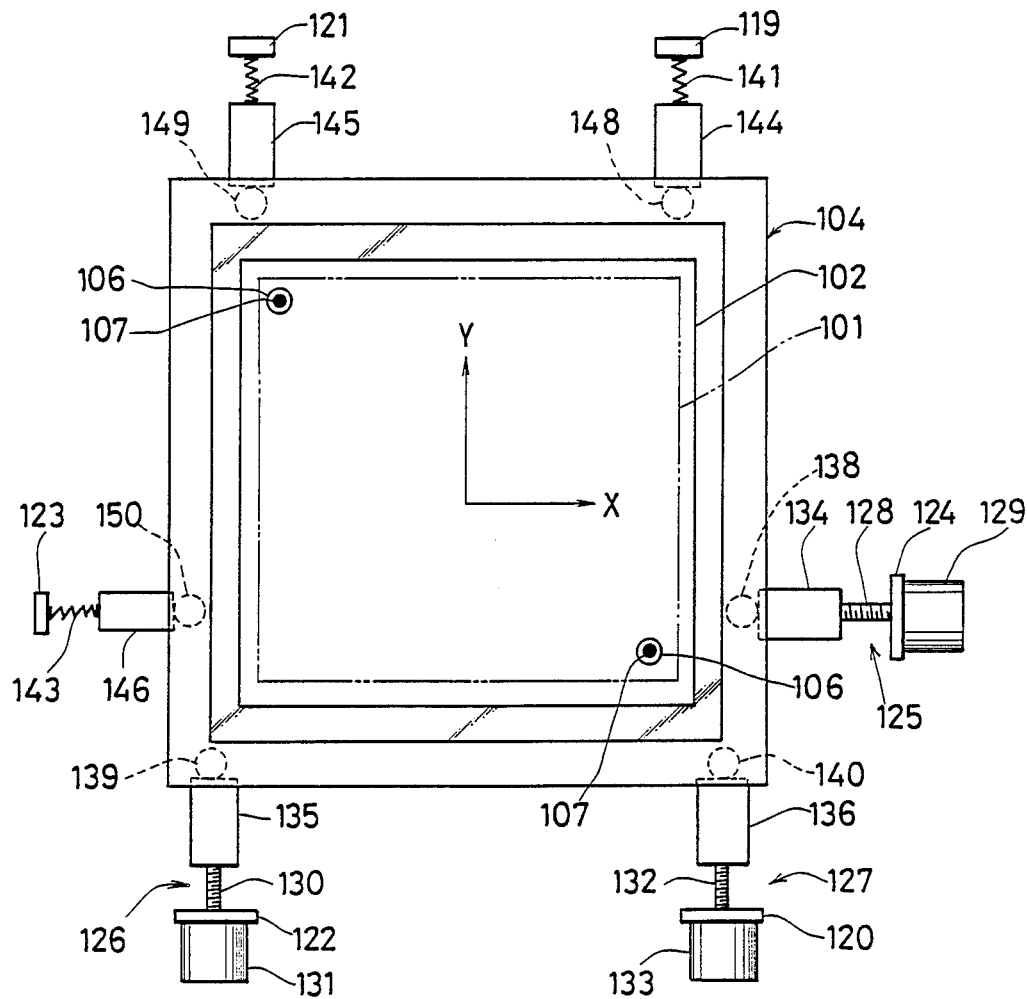
FIG. 13 illustrates a movement driver for aligning a board 101 to an photomask 102 included in another embodiment of the present invention in a direction perpendicular to the plane of the photomask 102.

With reference to FIGS. 13 ad 14, description is now made of still another embodiment of the present invention. These figures show a concrete example of movement driving mechanisms included in the aforementioned X-Y-θ direction driver 38, as well as a concrete mode of optical detection in case where alignment marks of a board are larger than those of a photomask.

FIG. 13 shows a front elevational view of a photomask 102 and a board 101, indicated by phantom lines, which is overlapped with the photomask 102. Each of the board 101 and the photomask 102 is provided with a plurality of, e.g., two alignment marks 106 or 107 in diagonally opposite positions. For example, the alignment marks 106 are provided as holes passing through the board 101. The alignment marks 107 are provided as non-transparent regions formed on the photomask 102 to be smaller than the alignment marks 106 of the board 101.

Referring to FIG. 14, a detection light source 108 employed for optically detecting the positions of the alignment marks 106 and 107 is arranged at the side of a board holder 103. The detection light source 108 requires no shutter corresponding to those of the light source 27 as shown in FIG. 1. The board holder 103, a photomask holder 104 and the detection light source 108 respectively correspond in structure to the board holder 10 or 11, the photomask holder 7 and the first position detecting light source 27 as shown in the aforementioned embodiment.

At the side of the photomask holder 104, a camera 109 is arranged as an optical sensor for receiving light from the detection light source 108. This camera 109 is formed by a digital address system optical sensor such as a CCD camera, which can pick up images of configurations of the alignment marks 106 and 107. When the alignment marks 106 and 107 are overlapped with each other as shown in FIG. 13, the light from the detection light source 108 is picked up in the form of a ring-shaped optical image by the camera 109. At this time, the positions of the alignment marks 106 and 107 correspond to the outer and inner peripheries of the ring-shaped optical image. Therefore, high-level and low-level signals are outputted from the camera 109 along a scanning line, so that the boundaries of the high-level and low-level signals may be determined as the positions of the alignment marks 106 and 107.

The camera 109 is retained on a horizontally and vertically movable camera support 110 as shown in FIG. 14. The camera support 110 is threadedly engaged with the outer periphery of a vertically extending screw shaft 111, to be vertically moved by rotation of a motor 112. At this time, the camera support 110 is guided by a rail 113 to retain the camera 109 in a constant direction. The mechanism including the screw shaft 111 and the motor 112 is retained to be horizontally moved by a pair of rails 115 and 116 horizontally extending on upper and lower portions of a frame 114. Such horizontal movement is caused by rotation of a screw shaft 118 coupled with a motor 117.

Thus, the camera 109 is horizontally and vertically movable in order to detect the positions of the alignment marks 106 and 107 distributed in a plurality of positions as shown in FIG. 13 by the single camera 109. The amounts of such horizontal and vertical movement of the camera 109 may be previously set in response to the positions of the alignment marks 106 of the boards 101 in the lot to be handled. According to such structure, lot change of the boards 101 to be handled can be coped with by merely re-inputting the data on the amounts of movement set for the camera 109, to enable multiproduct production in small amounts.

In order to align the board 101 to the photomask 102, the photomask holder 104 holding the photomask 102 is movable in the surface direction of the photomask 102. Before the photomask holder 104 is finally supported by the frame 114, some links are interposed as hereinafter described in detail.

FIG. 14 shows two brackets 119 and 120 extending outwardly from the frame 114, which brackets 119 and 120 are also shown in FIG. 13. FIG. 13 further shows brackets 121 to 124, which extend outwardly from the frame 114 similarly to the brackets 119 and 120. With respect to the brackets 119 to 124, an X-direction movement driving mechanism 125 is provided in relation to the bracket 124, while a first Y-direction movement driving mechanism 126 is provided in relation to the bracket 122 and a second Y-direction movement driving mechanism 127 is provided in relation to the bracket 120.

The X-direction movement driving mechanism 125 has a screw shaft 128 directed in the lateral direction, i.e., the direction X, which screw shaft 128 is rotated by an X motor 129. The first Y-direction movement driving mechanism 126 has a screw shaft 130 directed in the vertical direction, i.e., the direction Y, which screw shaft 130 is rotated by a Y1 motor 131. Further, the second Y-direction movement driving mechanism 127 has a screw shaft 132 directed in the direction Y, which screw shaft 132 is rotated by a Y2 motor 133. The motors 129, 131 and 133 are preferably formed by pulse motors capable of normal and reverse rotation for example, in order to attain correct rotation angles.

The aforementioned screw shafts 128, 130 and 132 are respectively threadedly engaged with followers 134, 135 and 136. FIG. 14 shows the manner of threaded engagement of the screw shaft 132 and the follower 136, while similar structure is employed between the screw shaft 128 and the follower 134 and between the screw shaft 130 and the follower 135.

As obvious from FIG. 14, the follower 136 is linearly moved in the vertical direction, i.e., the direction Y by rotation of the screw shaft 132 while being directed in a constant direction by a guide rail 137 provided in the frame 114. Similar structure is applied to the followers 134 and 135. Namely, the follower 134 is linearly moved in the lateral direction, i.e., the direction X by rotation of the screw shaft 128. Further, the follower 135 is linearly moved in the direction Y by rotation of the screw shaft 130.

Rotatable rollers 138, 139 and 140 are provided in first to third positions of the photomask holder 104. The roller 138 is in a position along a vertically extending edge of the photomask holder 104 which is substantially in the form of a square as a whole, while the rollers 139 and 140 are in positions along a laterally extending edge of the square-shaped photomask holder 104. The rollers 139 and 140 are laterally displaced from each other. Respective peripheral surfaces of the rollers 138, 139 and 140 are in contact with the followers 134, 135 and 136 respectively. As obvious from the roller 140 as shown in FIG. 14, the respective rollers 138 to 140 are provided with flanges on both ends thereof, so that front end portions of the followers 134 to 136 are held by the flanges to prevent axial displacement of the rollers 138 to 140 from the corresponding followers 134 to 136.

In relation to respective ones of the aforementioned brackets 119, 121 and 123, springs 141, 142 and 143 formed by compression springs for example are provided as spring means for retaining the respective followers 134 to 136 in contact with the rollers 138 to 140. Pressing members 144, 145 and 146 are coupled with respective forward ends of the springs 141, 142 and 143. For example, the pressing member 144 as shown in FIG. 14 is guided by a guide rail 147 provided in the frame 114 to be moved in a direction in which the spring 141 extends. Similar structure is employed for the pressing members 145 and 146.

The photomask holder 104 is provided with rotatable rollers 148, 149 and 150 to be in contact with the respective forward end portions of the pressing members 144, 145 and 146. As obvious from the roller 148 as shown in FIG. 14, these rollers 148 to 150 are also provided with flanges on both sides thereof, so that the forward end portions of the pressing members 144 to 146 are located between the flanges. Thus, the rollers 148 to 150 are prevented from axial displacement from the associated pressing members 144 to 146.

In the aforementioned structure, the spring 141 is mainly adapted to retain the follower 136 in contact with the roller 140 and the spring 142 is adapted to retain the follower 135 in contact with the roller 139, while the spring 143 is adapted to retain the follower 134 in contact with the roller 138.

Description is now made on the operation for aligning the board 101 to the photomask 102 in the parallel state as shown in FIG. 14.

The light supplied from the detection light source 108 reaches the camera 109 while providing the images of the alignment marks 106 and 107 as shown in FIG. 13. The camera 109 reads the images of the alignment marks 106 and 107 to supply its output to an image data processing unit 151. This image data processing unit 151 obtains the positions of the alignment marks 106 of the board 101 and the alignment marks 107 of the photomask 102, to store data on the said positions. Then the camera 109 is moved to detect other positions of the alignment marks 106 and 107, so that the image data processing unit 151 also stores positional data relating to the subsequently detected alignment marks 106 and 107. Then a position correction amount operating to control unit 152 operates the amount of movement for attaining proper positional relation between the photomask 102 and the board 101 from the data on the positions of the alignment marks 106 and 107 stored in the image data processing unit 151. Such operation is so performed as to find positions in which the two alignment marks 106 of the board 101 and the two alignment marks 107 of the photomask 102 are most accurately aligned to each other in average. Namely, if the pairs of alignment marks 106 and 107 cannot be coaxially aligned with each other, selection is performed on positions for averaging misalignment of the two pairs of alignment marks 106 and 107, i.e., not to align only one of the two pairs of alignment marks 106 and 107 while leaving the other pair misaligned.

The position correction amount operating unit 152 is adapted to operate the amounts of movement of the photomask holder 104 in the vertical, lateral and rotational directions to attain proper positional relation between the photomask 102 and the board 101, i.e., the directions and angles of rotation of the X motor 129, Y1 motor 131 and the Y2 motor 133, in concrete terms. Data on the results of such operation are supplied to an X output device 153, a Y1 output device 154 and a Y2 output device 155 respectively, which in turn provide the X motor 129, the Y1 motor 131 and the Y2 motor 133 with rotation of prescribed directions and angles.

As the result, the follower 134 is moved in a prescribed direction by a prescribed amount along the direction X, to move the photomask holder 104 in the direction X. Further, the follower 135 is displaced in a prescribed direction by a prescribed amount along the direction Y and the follower 136 is moved in a prescribed direction by a prescribed amount along the direction Y to move the photomask holder 104 in the direction Y. The photomask holder 104 is further displaced in the rotational direction in response to difference in amount of movement between the followers 135 and 136.

The rollers 138 to 140 and 148 to 150 being in contact with the followers 134 to 136 and the pressing members 144 to 146 are adapted to smoothly guide the movement of the photomask holder 104 in the vertical, lateral and rotational directions.

After the photomask 102 and the board 101 are properly aligned with each other, a prescribed surface of the board 101 is exposed by an exposure light source (corresponding to the exposure light source 3 of FIG. 1) arranged at the side of the photomask 102 in the same state or a state obtained by making either the board holder 103 or the photomask holder 104 approach the other one to bring the board 101 into proximity to the photomask 102. In such an exposure step, the camera 109 is retracted from an optical path defined from the exposure light source to the photomask 102, not to obstruct the exposure.

When either the board holder 103 or the photomask holder 104 must be driven to approach the other one in the aforementioned exposure step, for example, the photomask holder 104 is brought by an actuator 156, indicated by phantom lines in FIG. 14, into proximity to the board holder 103. This actuator 156 is mounted to directly act on the frame 114, so that the mechanism including the screw shaft 111 and the motor 112 is also moved in the horizontal direction, i.e., the direction Z with the photomask holder 104 and the frame 114 through the operation of the actuator 156. At this time, the assembly including the photomask holder 104 and so on, driven by the actuator 156, is preferably correctly moved in the horizontal direction in a parallel manner through a guide rail 157.

When two board holders are employed to be located in different positions in the exposure station, i.e., to be different in distance from the photomask holder from each other, two actuators each corresponding to the aforementioned actuator 156 may be coupled in the series form. Namely, the photomask holder can be moved by a longer distance by driving both of the actuators, while the same can be moved by a shorter distance by driving only one of the actuators.

The embodiment as shown in FIGS. 13 and 14 can be modified in certain respects.

For example, positions on the photomask holder 104 subjected to actions of the X-direction movement driving mechanism 125, the first Y-direction movement driving mechanism 126 and the second Y-direction movement driving mechanism 127 can be arbitrarily selected. With respect to positional relation between such points of application, respective points of application of the first and second Y-direction movement driving mechanisms may only laterally deviate from each other.

The spring means such as the springs 141 to 143 provided for retaining the followers 134 to 136 in contact with the rollers 138 to 140 can be arranged as follows: A single spring serving as both of the springs 141 and 142 may be arranged in a substantially intermediate position of the springs 141 and 142, for example. Further, all of the springs 141 to 143 may be replaced in action by a single spring. The single spring in this case may be adapted to supply force in the diagonal direction for coupling the upper left corner and the lower right corner of the photomask holder 104 in FIG. 13 in a direction from the upper left corner to the lower right corner.

The movement driving mechanisms 125, 126 and 127 for providing lateral or vertical movement to the prescribed points on the photomask holder 104 are not restricted to the combination of the screw shafts and the followers threadedly engaged with the same, but may be replaced by mechanisms such as cylinders which can correctly provide linear movement. Although the actions from the movement driving mechanisms 125 to 127 are transmitted to the photomask holder 104 by rolling contact through the rollers 138 to 140 and 148 to 150, such actions may be transmitted simply by sliding contact.

In each of the embodiments as shown in FIGS. 7 and 13, the alignment marks 22 or 106 of the board 1 or 101 are detected by the optical sensor 29 or the camera 109 through the transmitted light, such detection may be performed through a system of detecting reflected light. However, the alignment marks of the board, particularly those formed by through holes are generally inferior in working accuracy, and edge portions of such through holes are slightly rugged. Thus, the light is irregularly reflected in such rugged portions, to reduce reliability of the positional detection based on the reflected light.

When the alignment marks of the board are detected by the reflected light as hereinabove described, the alignment marks 22 of the board 1 are also detected by the light 34 from the second position detecting light source 28 in the embodiment as shown in FIG. 7.

When, in the embodiment as shown in FIG. 7, the alignment marks 22 of the board 1 detected on the basis of the reflected light are larger than the alignment marks 23 of the photomask 2, the optical sensor may be arranged on the same area with the first position detecting light source 27.

In the embodiment as shown in FIGS. 13 and 14, the detection light source 108 and the camera 109 may be reversed in positional relation.

In the embodiment as shown in FIGS. 1 to 9 or 14 and 15, a single optical sensor 29 or camera 109 is employed to detect the positions of the two alignment marks 22 or 106 of the board 1 or 101 and the two alignment marks 23 or 107 of the photomask 2 or 102. However, an optical sensor or camera may be provided for each of the alignment marks of the board and those of the photomask, in order to save the time for detecting the positions thereof.

The present invention is also applicable to double-sided exposure of boards. In this case, another group of the elements from the exposure light source 3 to the first position detecting light source 27 may be provided in reverse sequence of arrangement for the loader 18 as shown in FIG. 2, for example. FIGS. 15, 16 and 17 show three such examples, in which boards 1 having been subjected to single-sided exposure may be taken out from loaders 18 to be subjected to exposure on the other sides.

Referring to FIG. 15, two groups of elements from exposure light sources 3 to first position detecting light sources 27 are arranged on one side of a series loader 18 such that the first position detecting light sources 27 are back to back with each other.

Referring to FIG. 16, two groups of elements from exposure light sources 3 to first position detecting light sources 27 are arranged on one side of a series loader 18, such that the exposure light sources 3 are back to back with each other.

Referring to FIG. 17, two groups of elements from exposure light sources 3 to first position detecting light sources 27 are arranged on both sides of a series loader 18 to face opposite directions.

Figure 18:
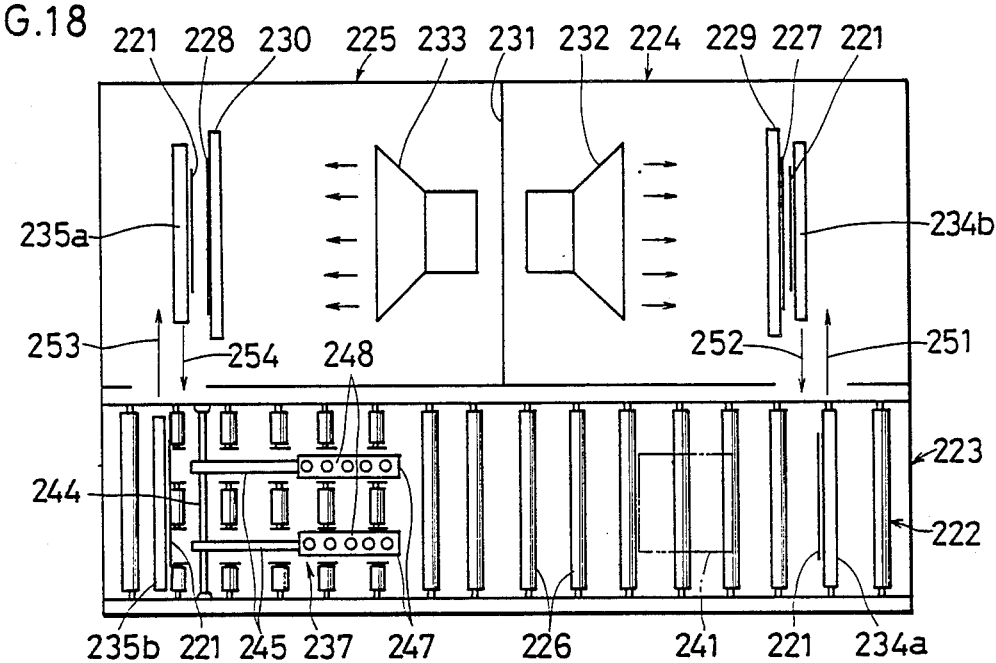
FIG. 18 is a top plan view generally showing a further embodiment of the present invention.
Figure 19:
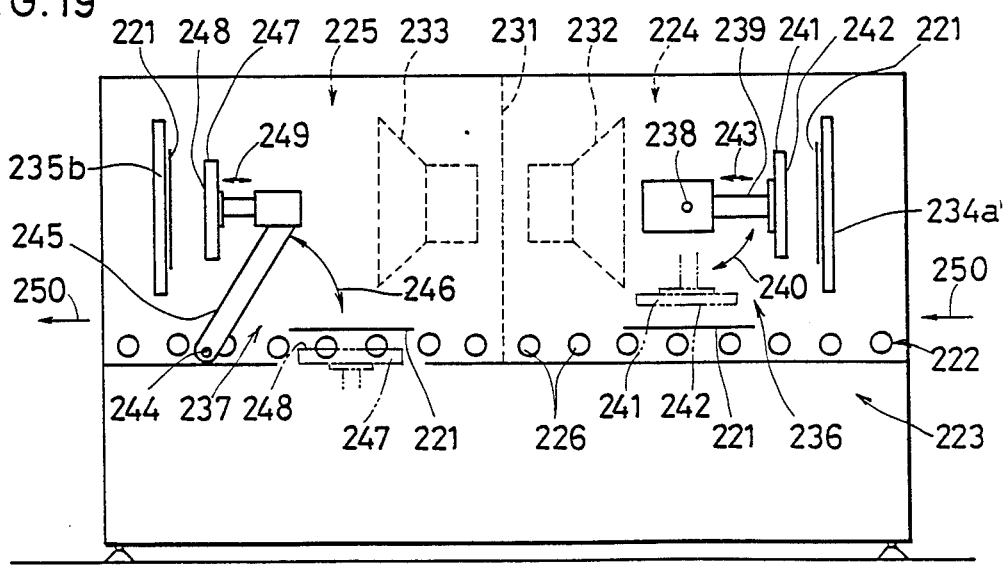
FIG. 19 is a front elevational view schematically showing the exposure apparatus as shown in FIG. 18.

While the loaders 18 as shown in FIGS. 2 and 15 to 17 are adapted to carry the boards 1 in upwardly extending states, a loader for carrying boards in horizontal states may be employed as in the following embodiment as shown in FIGS. 18 and 19.

An exposure apparatus as shown in FIGS. 18 and 19 comprises a conveyor station 223 provided with a conveyor 222 for carrying horizontally placed boards 221 and first and second exposure stations 224 and 225 adjacent to both sides of the conveyor station 223 along the longitudinal direction of the conveyor 222. First sides of the boards 221 are exposed in the first exposure station 224, and the other sides thereof are exposed in the second exposure station 225. The conveyor 222 is formed by a plurality of feed rolls 226 according to this embodiment.

The first and second exposure stations 224 and 225 include common elements in structure. In the first and second exposure stations 224 and 225, first and second photomasks 227 and 228 are vertically held by first and second photomask holders 229 and 230 respectively. First and second exposure light sources 232 and 233 are arranged between an interface 231 between the first and second exposure stations 224 and 225 and the first and second photomasks 227 and 228. The first and second exposure light sources 232 and 233 are back to back with each other to radiate light on the first and second photomasks 227 and 228 respectively.

Further, first and second board holders 234a, 234b and 235a, 235b are provided to reciprocate between positions of the first and second exposure stations 224 and 225 for receiving the light from the first and second exposure light sources 232 and 233 respectively through the first and second photomasks 227 and 228 and the conveyor station 223 while vertically holding the boards 221. According to this embodiment, a pair of right-side board holders 234a and 235a and a pair of left-side board holders 234b and 235b are provided as the first and second board holders. Thus, when, for example, the right-side board holder 234a of the first board holders is in the ccnveyor station 223, the left-side board holder 234b is located in the first exposure station 224 to alternately perform reciprocation. The board holders may be provided one for each exposure station 224 or 225.

The conveyor station 223 is provided with first and second transfer mechanisms 236 and 237 for the boards 221 between the conveyor 222 and the first and second board holders 234a, 234b, 235a and 235b.

The first transfer means 236 has a first rotary shaft 238 horizontally directed to the cross direction of the conveyor 222. A first arm 239 is supported by the first rotary shaft 238. The first arm 239 is reciprocatingly rotated about the first rotary shaft 238 as indicated by an arrow 240. A first suction member 241 is held at the end portion of the first arm 239. The first suction member 241 has a first suction face 242 facing a direction capable of sucking the upper surface of the board 221 on the conveyor 222. The sucking face 242 has a plurality of pores (not shown) to clamp the board 221 through vacuum suction, for example. Further, the first arm 239 is formed by a plurality of rods and cylinders (not shown), so that the first suction member 241 is reciprocatingly displaced in a direction perpendicular to the first suction face 242, as indicated by an arrow 243.

The second transfer mechanism 237 has a second rotary shaft 244 horizontally directed to the cross direction of the conveyor 222. Second arms 245 are supported by the second rotary shaft 244. The second arms 245 are reciprocatingly rotated about the second rotary shaft 244, as indicated by an arrow 246. Second suction members 247 are held at the end portions of the second arms 245. Each second suction member 247 has a second suction face 248 facing a direction capable of sucking the lower surface of the board 221 on the conveyor 222. This suction face 248 also has pores for clamping the board 221 through vacuum suction. Each of the second arms 245 comprises, e.g., a plurality of rods and cylinders (not shown), so that the second suction member 247 is reciprocatingly displaced in a direction perpendicular to the second suction face 248 as indicated by an arrow 249.

On the basis of the aforementioned structure, description is now made on the operation of the exposure apparatus.

The conveyor 222 is driven to carry the boards 221 in the direction as indicated by an arrow 250 in FIG. 19. Each board 221 carried by the conveyor 222 in a horizontal state is first brought into a position adjacent to the first exposure station 224. Then the first transfer mechanism 236 brings the first suction member 241 in a state opposite to the upper surface of the board 221, as indicated by phantom lines. Then the first suction member 241 reciprocates in the direction of the arrow 243 to clamp the upper surface of the board 221 by the suction face 242 and lift up the board 221 in this state. Then the first arm 239 is rotated by 90° upwardly along the arrow 240, to bring the board 221 in a position opposite to the right-side first board holder 234a. The first suction member 241 reciprocates along the arrow 243, to transfer the board 221 to the right-side first board holder 234a at a terminating end of the reciprocation. Similarly to the board holder 10 as shown in FIG. 4, the right-side first board holder 234a is adapted to vacuum-clamp the board 221. In this stage, the vacuum suction supplied to the first suction member 241 is temporarily cut off.

The right-side first board holder 234a holding a board 221 to be subsequently exposed is brought into the first exposure station 224 along the arrow 251, so that the board 221 is exposed by the first exposure light source 232 through the first photomask 227. On the other hand, the left-side first board holder 234b holding the board 221 already subjected to single-sided exposure is brought into the conveyor station 223 along an arrow 252.

In the conveyor station 223, the first suction member 241 again reciprocates along the arrow 243, to vacuum-clamp the board 221 having been subjected to single-sided exposure. Then the first arm 239 is rotated by 90° downwardly along the arrow 240 to bring the first suction member 241 to a position opposite to the conveyor 222, so that the first suction member 241 reciprocates along the arrow 243 to place the board 221 on the conveyor 222. The board 221 currently placed on the conveyor 222 has been exposed on its upper surface.

The board 221 thus exposed on its upper surface is carried along the arrow 250 by the conveyor 222, to be brought into a position adjacent to the second exposure station 225. The second transfer mechanism 237 being in this position has located the second suction member 247 in a position lower than the carrier surface of the conveyor 222 as shown by phantom lines, before the board 221 is carried.

With respect to the board 221 brought in the position adjacent to the second exposure station 225 as hereinabove described, the second transfer mechanism 237 operates as follows: the second suction members 247 are upwardly displaced along the arrow 249 from the position as indicated by the phantom lines in FIG. 19, so that the second suction face 248 is in contact with the lower surface of the board 221 to vacuum-clamp the board 221 and raise the same upwardly from the conveyor 222. Then, the second arms 245 are upwardly rotated by 90° about the second rotary shaft 244 along the arrow 246, and are operated so that the second suction member 247 holding the board 221 reciprocates as indicated by the arrow 249. In response to this, the board 221 held by the second suction member 247 is transferred to the left-side second board holder 235b.

The left-side second board holder 235b, is then moved to the second exposure station 225 along an arrow 253 as shown in FIG. 18, so that the other surface of the board 221 is exposed. In place of the left-side second board holder 235b, the right-side second board holder 235a is moved to the conveyor station 223 along an arrow 254. The right-side second board holder 235a, holds the board 221 subjected to double-sided exposure.

With respect to the board 221 subjected to double-sided exposure, the second transfer mechanism 237 functions as follows: In the state indicated by solid lines in FIG. 19, the second suction members 247 reciprocate along an arrow 249 to vacuum-clamp the board 221 held by the board holder 235a to unload the same from the board holder 235a. When the second suction members 247 thus hold the board 221, the second arms 245 are downwardly rotated along an arrow 246, to place the board 221 on the conveyor 222. The second suction members 247 are brought into a position lower than the carrier surface of the conveyor 222 as shown by the phantom lines so as not to interfere with a board 221 subsequently carried by the conveyor 222.

The aforementioned operations are sequentially performed on a single board 221, while being simultaneously performed in the first and second exposure stations 224 and 225 for handling or treating a plurality of boards 221.

The conveyor 222 may not carry the board 221 along the arrow 250 (FIG. 19), but in a reverse direction.

Although the first and second rotary shafts 238 and 244 are provided in fixed positions, the same may be vertically movable when the conveyor 222 is located in a lower position, for example. Namely, the first and second rotary shafts 238 and 244 are downwardly moved when the board 221 is to be transferred from and to the conveyor 222.

When two board holders are provided in relation to each of the exposure stations 224 and 225, the reciprocation along the arrow 243 or 249 may be performed in two stages by employing, e.g., two series cylinders, in order to cope with difference between positions of the two board holders. Namely, the operation of a first stage is performed on a closer board holder 234b or 235a, while the operation of a second stage is performed on the other board holder 234a or 235b.

According to the embodiment as shown in FIGS. 18 and 19 as hereinabove described, the first transfer mechanism 236 vacuum-clamps the upper surface of the board 221 placed on the conveyor 222 while the second transfer mechanism 237 vacuum-clamps the lower surface thereof. Namely, satisfied is such a condition that, in the board 221 placed on the conveyor 222, clamped is a surface to be exposed. Thus, the surface of the board to be exposed can be directed to the exposure light source while directing the surface opposite to the said surface to be subsequently exposed to the board holder without adding a mechanism for inverting the board in relation to the conveyor.

In each of the embodiments as hereinabove described with reference to FIGS. 15 to 19, an exposure light source for each surface of a board, i.e., two exposure light sources have been employed in order to expose both surfaces of the board. However, only a single exposure light source may be employed to expose both surfaces of a board by selectively switching the optical path thereof, as shown in FIG. 20.

Figure 20:
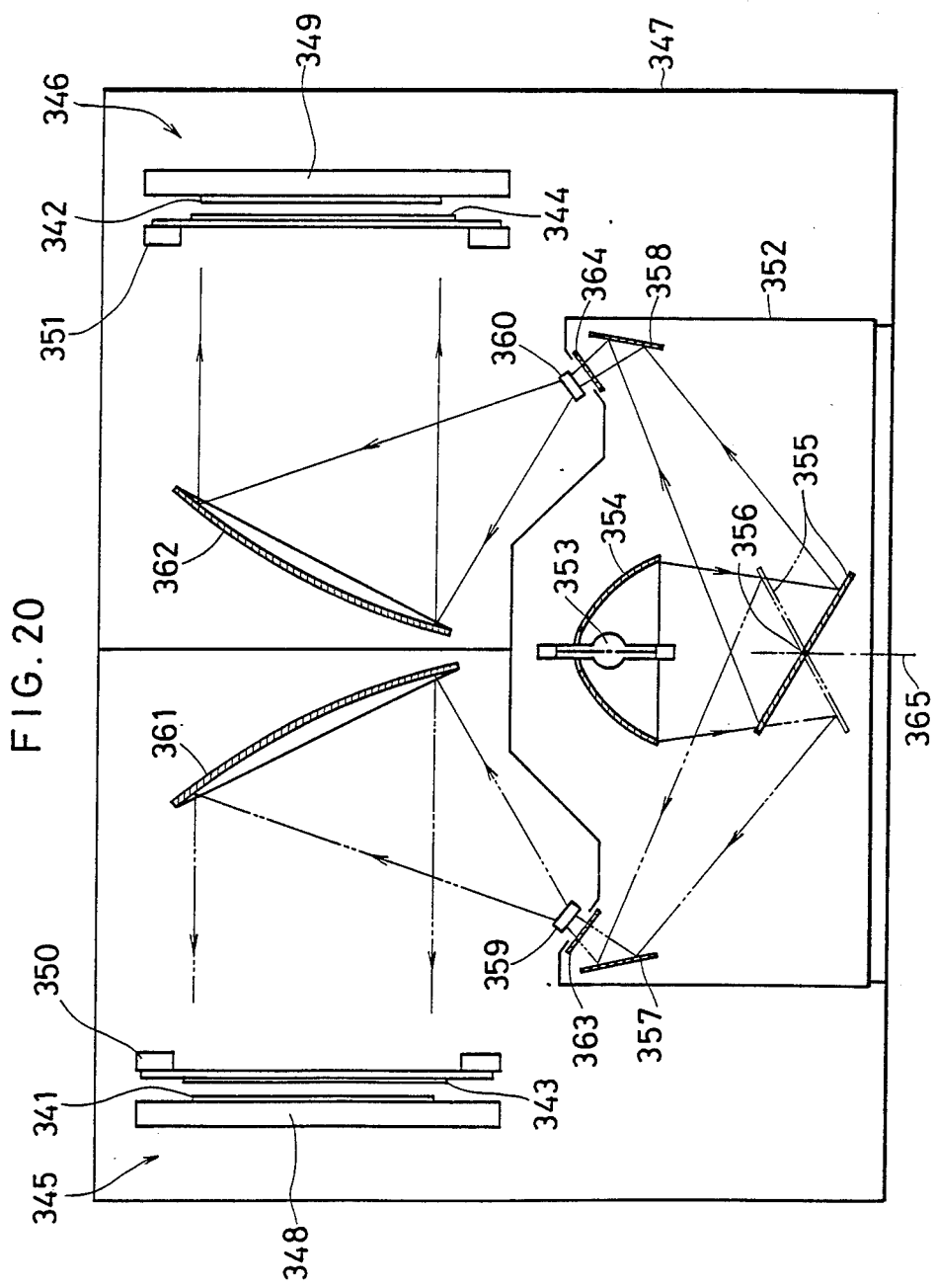
FIG. 20 is a front elevational view showing a further embodiment of the present invention, particularly optical elements.

An exposure apparatus as shown in FIG. 20 is adapted to expose boards 341 and 342 while vertically holding the boards 341 and 342 and photomasks 343 and 344. A first exposure part 345 for exposing a first surface of the board 341 and a second exposure part 346 for exposing a second surface thereof are located on horizontal both end portions of an apparatus housing 347. The photomasks 343 and 344, respectively held by photomask holders 350 and 51, are located in inner positions with respect to the related boards 341 and 342, so that exposure processing is performed by light from a central portion.

The boards 341 and 342 are respectively held by board holders 348 and 349, which are moved perpendicularly to the plane of FIG. 20 to reciprocate between a standby station (not shown) and an exposure station provided with the exposure parts 345 and 346. In the standby station, the boards 341 and 342 are automatically loaded to/unloaded from the board holders 348 and 349.

In relation to respective ones of the first and second exposure parts 345 and 346, operations such as exposure, alignment of the photomasks 343 and 344 and the boards 341 and 342, movement of the board holders 348 and 349 and so on are performed, which operations are not simultaneously performed in the first and second exposure parts 345 and 346, but deviate in time. In particular, exposure operations are performed in different time zones in respective ones of the first and second exposure parts 345 and 346. Namely, when exposure is performed in the first exposure part 345, another operation is performed in the second exposure part 346.

Description is now made on a light source for exposure and optical elements.

As shown in FIG. 20, a light source cabinet 352 is provided in the central portion of the apparatus housing 347, and an exposure light source 353 is vertically provided in the central portion of the light source cabinet 352. This exposure light source 353 is adapted to provide a point light source, and is formed by a short arc lamp, for example. Light from the exposure light source 353 is collected and reflected by a spheroid mirror 354, to be downwardly directed.

The light from the spheroid mirror 354 is reflected by a plane mirror 355. This plane mirror 355 has a rotary shaft 356 extending perpendicularly to the plane of FIG. 20, to be changed in angle between two positions indicated by solid and phantom lines. Such angle change is performed by providing the rotary shaft 356 with, e.g., a lever which is rotated by an air cylinder or the like.

By changing the angle of the plane mirror 355, the light from the spheroid mirror 354 is reflected in the left-hand direction and right-hand direction in FIG. 20, to be selectively directed to an optical path toward the first exposure part 345 and a second optical path toward the second exposure part 346. The first and second optical paths include the same optical elements as hereinafter described.

The light reflected by the plane mirror 355 is reflected by a plane mirror 357 or 358 and changed in direction to pass through a fly eye 359 or 360 and introduced into a large-size curved mirror 361 or 362, thereby being finally converted into parallel rays, which are transmitted to the first or second exposure part 345 or 346. Although the curved mirrors 361 and 362 are ideally provided with paraboloids of revolution, the same may be merely provided with simply worked spherical surfaces.

The aforementioned optical elements from the exposure light source 353 to the fly eyes 359 and 360 are contained in the light source cabinet 352, to prevent outward leakage of unwanted light. Preferably shutters 363 and 364 capable of opening and closing are provided between the plane mirrors 357 and 358 and the fly eyes 359 and 360.

When exposure processing is performed on the board 341 in the first exposure part 345, the plane mirror 355 is set at an angle as shown by the phantom lines to open the shutter 363, so that the light from the exposure light source 353 is supplied to the first exposure part 345. At this time, the shutter 364 is closed to prevent leakage of unwanted light to the second exposure part 346.

When, on the other hand, exposure processing is performed on the board 342 in the second exposure part 346, the angle of the mirror 355 is changed as indicated by the solid line to open the shutter 364, so that the light from the exposure light source 353 is supplied to the board 342. The shutter 363 is closed at this time.

In the aforementioned embodiment, the optical elements from the spheroid mirror 354 to the curved mirrors 361 and 362 are employed as first optical means for converting the light from the exposure light source 353 into parallel rays, while the plane mirror 355 is employed as second optical means which can be changed in angle between two positions for selectively directing the light from the single exposure light source 353 to the first optical path from the plane mirror 357 to the curved mirror 361 and the second optical path from the plane mirror 358 to the curved mirror 362. Namely, the first optical means is provided in relation to the first and second optical paths respectively.

However, the first optical means may be included in the second optical means by integrally forming the plurality of optical elements included in the second optical means to perform angle change, thereby to selectively provide first and second optical paths. In concrete terms with reference to FIG. 20, for example, the plane mirror 358, the fly eye 360 and the curved mirror 362 may be omitted while relatively fixing the plane mirrors 355 and 357, the fly eye 359 and the curved mirror 361, so that the integrated assembly may be rotated about a rotary shaft 365 as indicated by a one-dot chain line in FIG. 20. Also in such structure, the light can be selectively directed to both of the first and second exposure parts 345 and 346 through the single exposure light source 353.

The embodiment of FIG. 20 can also be modified as follows: Although this modification is not much preferable since the exposure light source 353 may be subjected to an impact, the same is sufficiently practical if the said point is improved. Namely, the exposure light source 353 and the spheroid mirror 354 may also be rotated about the rotary shaft 365, in addition to the aforementioned optical elements.

According to the embodiment of FIG. 20 as hereinabove described, employed is only a single exposure light source such as a short arc lamp which is high-priced and of relatively short life, thereby to reduce the apparatus cost and running cost. Further, in consideration of the short life of the point light source such as a short arc lamp, the single light source may not be so frequently exchanged, whereby the exposure apparatus is improved in operation rate as the result.

In case where two exposure light sources are employed, the light sources may be varied in luminous characteristics to cause difference in exposure conditions between first and second surfaces of a board, while such a problem of variation is not caused in this embodiment, which employs only a single exposure light source.

Even if only a single exposure light source is employed as in this embodiment and hence exposure cannot be simultaneously performed in both of first and second exposure parts, operations such as loading or unloading of a board, alignment of the board to a photomask and so on are performed in the exposure part not being under exposure and the time required for such operations is identical to or longer than the time required for exposure, whereby the exposure apparatus as shown in FIG. 20 is not inferior in exposure throughput, i.e., the number of handled boards, to the respective embodiments as shown in FIGS. 15 to 19 comprising two exposure light sources to perform exposure in both of the first and second exposure parts.

Although the present invention has been described and illustrated in detail, it is clearly understood that the same is by way of illustration and example only and is not to be taken by way of limitation, the scope of the present invention being limited only by the terms of the appended claims.

What is claimed is:

1. An exposure apparatus for arranging a photomask having a plurality of alignment marks in opposition to a surface to be exposed of a board having a plurality of corresponding alignment marks, with said alignment marks being substantially aligned with each other to radiate light through said p hotomask to thereby expose said board, said alignment marks of said board being different in size from said alignment marks of said photomask, said exposure apparatus comprising:

a board standby station and an exposure station;
a board holder, operable to transmit light, for holding said board by vacuum suction and reciprocating between said board standby station and said exposure station;
a photomask holder for holding said photomask in said exposure station;
optical detecting equipment including a position detecting light source and an optical sensor for detecting said alignment marks of both said board and said photomask overlapping in said exposure station;
comparing equipment for comparing positions of said alignment marks of said board detected by said optical sensor with the positions of said alignment marks of said photomask;
X-Y-θ direction driving equipment for moving said photomask holder in vertical, lateral and rotational directions to correct misalignment of said alignment marks based on data obtained by said comparing equipment; and
an exposure light source for radiating light on said board through said photomask, wherein said alignment marks of said board are larger than corresponding ones of said alignment marks of said photomask, said alignment marks of said board being formed as through holes provided in said board and said alignment marks of said photomask being formed as non-transparent regions provided in said photomask and said position detecting light source and said optical sensor provided in said optical detecting equipment are oppositely arranged to put therebetween said board and said photomask overlapping in said exposure station, whereby said alignment marks of said board and said photomask are detected by said optical sensor by light transmitted from said position detecting light source, said board holder having a suction face adapted to engage and hold the board with suction applied through a plurality of suction holes formed in and throughout substantially the entire area of the face, said suction holes being chamfered to prevent substantial variation in density of light transmitted through the suction face from the position detecting light source.

2. An exposure apparatus in accordance with claim 1, further comprising a Z-direction movement driving mechanism for causing relative movement of said board holder and said photomask holder to make said board, being held on said board holder in said exposure station, move towards and away from said photomask held by said photomask holder.

3. An exposure apparatus in accordance with claim 2, wherein said Z-direction movement driving mechanism is adapted to move said board holder.

4. An exposure apparatus in accordance with claim 2, wherein said Z-direction movement driving mechanism is adapted to move said photomask holder.

5. An exposure apparatus in accordance with claim 1, wherein said alignment marks of aid board are smaller than corresponding ones of said alignment marks of said photomask, said alignment marks of said board being formed as through holes provided in said board and alignment marks of said photomask being formed as transparent regions provided in said photomask, said position detecting light source provided in said optical detecting equipment having a first position detecting light source located at the side of said photomask facing the board and a second position detecting light source located at the opposite side of said photomask in said exposure station and said optical sensor is arranged at said opposite side of said photomask holder, whereby said alignment marks of said board are detected by said optical sensor through transmitted light from said first position detecting light source and said alignment marks of said photomask are detected by said optical sensor through reflected light from said second position detecting light source.

6. An exposure apparatus in accordance with claim 1, wherein said board holder has first and second board holders which are controlled to repeat such operations that said second board holder loads/unloads said board being in said board standby station when said first board holder is in said exposure station, and said first and second board holders are replaced by each other in a subsequent stage.

7. An exposure apparatus in accordance with claim 1, wherein said photomask holder is a double-layer structure of a relatively rigid transparent board and a relatively flexible transparent film, said transparent film being expanded by an increase in air pressure in a clearance between said transparent board and said transparent film and said photomask is fixed on an outer surface of said transparent film.

8. An exposure apparatus in accordance with claim 1 wherein said X-Y-$\theta$ direction driving mechanism includes:
 an X-direction movement driving mechanism for laterally moving a first point on said photomask holder,
 a first Y-direction movement driving mechanism for vertically moving a second point on said photomask holder, and
 a second Y-direction movement driving mechanism for vertically moving a third point on said photomask holder, said third point being laterally displaced from said second point.

9. An exposure apparatus in accordance with claim 8, wherein said photomask holder is substantially in the form of a square and said first point is located in a position along a vertically extending edge of said square while said second and third points are located in positions along a laterally extending edge of said square.

10. An exposure apparatus in accordance with claim 9, wherein each of said X-direction movement driving mechanism and said first and second Y-direction movement driving mechanism has a screw shaft driven by a motor and a follower threadedly engaged with said screw shaft to be linearly moved by rotation of said screw shaft, said screw shaft being provided in a fixed position and said follower being coupled to said photomask holder.

11. An exposure apparatus in accordance with claim 10, wherein each of said first, second and third points is provided with a rotatable roller so that each said follower is in contact with the peripheral surface of said roller to transmit its operation to said photomask holder, and spring means for urging said photomask holder to be displace to retain said follower and said roller in contact with each other.

12. The exposure apparatus of claim 1, wherein said board holder is mounted to a frame defining a suction space extending substantially continuously along the holder through which suction is applied to the suction holes.

13. An exposure apparatus for arranging a photomask having a plurality of alignment marks in opposition to a surface to be exposed to a board having a plurality of corresponding alignment marks, with said alignment marks being substantially aligned with each other to radiate light through said photomark to thereby expose said board, said alignment marks of said board being different in size from said alignment marks of said photomask, said exposure apparatus comprising:
 a board standby station and an exposure station;
 a board holder, operable to transmit light, for holding said board by vacuum suction and reciprocating between said board standby station and said exposure station;
 a photomask holder for holding said photomask in said exposure station;
 optical detecting equipment including a position detecting light source and an optical sensor for detecting said alignment marks of both said board and said photomask overlapping in said exposure station;
 comparing equipment for comparing positions of said alignment marks of said board detected by said optical sensor with the positions of said alignment marks of said photomask;
 X-Y-$\theta$ direction driving equipment for moving said photomask holder in vertical, lateral and rotational directions to correct misalignment of said alignment marks based on data obtained by said comparing equipment; and
 an exposure light source for radiating light on said board through said photomark, wherein said board is subjected to double-sided exposure, said board standby station having a conveyor station including a conveyor for carrying said board, said exposure station having first and second exposure stations longitudinally adjacent each other on a side of said conveyor station along said conveyor, said photomask holder having first and second photomask holders respectively located in said first and second exposure stations, said exposure light source arranged to radiate light from between said first and second photomask holders toward respective ones of said first and second photomask holders, and said board holder having first and second board holders reciprocating between positions for receiving said light from said exposure light source through said first and second photomasks respectively and said conveyor station.
 wherein said board is substantially horizontally carried on said conveyor and said conveyor station is provided with first and second transfer mechanisms for transferring said board between said conveyor and said first and second board holders, said first transfer mechanism having a first rotary shaft extending above said conveyor, a first arm reciprocatingly rotated about said first rotary shaft and a first suction member held by an end portion of said first arm and having a first suction face capable of attachment by suction to the upper surface of said board on said conveyor, said second transfer mechanism having a second rotary shaft extending above said conveyor, a second arm reciprocatingly rotated about said second rotary shaft and a second suction member held by an end portion of said second arm and having a second suction face capable of attachment by suction to the lower surface of said board on said conveyor,
 wherein said exposure light source is formed by a single point light source and said apparatus further includes first optical means for converting light from said exposure light source into parallel rays and second optical means whose angle can be changed between two positions for selectively directing said light from said exposure light source to a first optical path and a second optical path, so that one side of said board is exposed by said light passing through said first optical path when said board is in said first exposure station and the other side of said board is exposed by said light passing through said second optical path when said board is in said second exposure station, wherein said first optical means is provided in relation to said first optical path and said second optical path respectivey, and wherein said second optical means is a mirror mounted such that the angle of its reflecting surface can be changed.

14. An exposure apparatus in accordance with claim 13, wherein said exposure light source has first and second exposure light sources arranged back to back with each other.

* * * * *